(12) United States Patent
Glass et al.

(10) Patent No.: US 10,879,241 B2
(45) Date of Patent: Dec. 29, 2020

(54) TECHNIQUES FOR CONTROLLING TRANSISTOR SUB-FIN LEAKAGE

(71) Applicant: INTEL CORPORATION, Santa Clara, CA (US)

(72) Inventors: Glenn A. Glass, Portland, OR (US); Prashant Majhi, San Jose, CA (US); Anand S. Murthy, Portland, OR (US); Tahir Ghani, Portland, OR (US); Daniel B. Aubertine, North Plains, OR (US); Heidi M. Meyer, Hillsboro, OR (US); Karthik Jambunathan, Hillsboro, OR (US); Gopinath Bhimarasetti, Portland, OR (US)

(73) Assignee: INTEL Corporation, Santa Clara, CA (US)

( * ) Notice: Subject to any disclaimer, the term of this patent is extended or adjusted under 35 U.S.C. 154(b) by 0 days.

(21) Appl. No.: 15/754,871

(22) PCT Filed: Sep. 25, 2015

(86) PCT No.: PCT/US2015/052280
§ 371 (c)(1),
(2) Date: Feb. 23, 2018

(87) PCT Pub. No.: WO2017/052601
PCT Pub. Date: Mar. 30, 2017

(65) Prior Publication Data
US 2018/0247939 A1 Aug. 30, 2018

(51) Int. Cl.
*H01L 27/092* (2006.01)
*H01L 29/06* (2006.01)
(Continued)

(52) U.S. Cl.
CPC ......... *H01L 27/0924* (2013.01); *B82Y 10/00* (2013.01); *H01L 21/02238* (2013.01);
(Continued)

(58) Field of Classification Search
CPC ............................ H01L 27/0924; B82Y 10/00
See application file for complete search history.

(56) References Cited

U.S. PATENT DOCUMENTS 8,610,201 B1    12/2013   Hokazono
8,987,823 B2 *   3/2015   Cheng .................. H01L 21/845
                                                                257/350
(Continued)

FOREIGN PATENT DOCUMENTS

CN       101577278 A     11/2009
CN       104599956 A      5/2015
(Continued)

OTHER PUBLICATIONS

International Search Report and Written Opinion received for PCT No. PCT/US2015/052280. dated Jun. 9, 2016. 16 pages.
(Continued)

*Primary Examiner* — Wael M Fahmy
*Assistant Examiner* — Sarah K Salerno
(74) *Attorney, Agent, or Firm* — Finch & Maloney PLLC

(57) ABSTRACT

Techniques are disclosed for controlling transistor sub-fin leakage. The techniques can be used for highly scaled finFETs, as well as other non-planar transistors. In some cases, the techniques include exposing a middle portion of a fin structure formed on a substrate and then converting the exposed portion to an electrically isolating material via a doping or oxidation process. For example, a monolayer doping (MLD) process may be used to deliver dopants to the exposed portion of the fin in a self-saturated monolayer scheme. In another example case, thermal oxidation may be
(Continued)

used to convert the exposed portion to an insulator material. In some cases, a barrier layer (e.g., including carbon doping) may be located above the exposed portion of the fin to help prevent the doping or oxidation process from affecting the upper region of the fin, which is used for the transistor channel.

18 Claims, 14 Drawing Sheets

(51) Int. Cl.
| | |
|---|---|
| H01L 29/10 | (2006.01) |
| H01L 29/78 | (2006.01) |
| H01L 29/66 | (2006.01) |
| B82Y 10/00 | (2011.01) |
| H01L 29/775 | (2006.01) |
| H01L 29/786 | (2006.01) |
| H01L 21/02 | (2006.01) |
| H01L 21/762 | (2006.01) |
| H01L 21/8238 | (2006.01) |
| H01L 29/08 | (2006.01) |
| H01L 29/36 | (2006.01) |
| H01L 29/423 | (2006.01) |
| H01L 21/225 | (2006.01) |
| H01L 21/306 | (2006.01) |
| H01L 21/308 | (2006.01) |
| H01L 21/324 | (2006.01) |

(52) U.S. Cl.
CPC ............ *H01L 21/76205* (2013.01); *H01L 21/823821* (2013.01); *H01L 21/823878* (2013.01); *H01L 29/0649* (2013.01); *H01L 29/0673* (2013.01); *H01L 29/0847* (2013.01); *H01L 29/1037* (2013.01); *H01L 29/1079* (2013.01); *H01L 29/36* (2013.01); *H01L 29/42392* (2013.01); *H01L 29/66439* (2013.01); *H01L 29/66795* (2013.01); *H01L 29/66803* (2013.01); *H01L 29/775* (2013.01); *H01L 29/785* (2013.01); *H01L 29/78696* (2013.01); *H01L 21/2252* (2013.01); *H01L 21/3081* (2013.01); *H01L 21/30604* (2013.01); *H01L 21/324* (2013.01); *H01L 29/66545* (2013.01)

(56) References Cited

U.S. PATENT DOCUMENTS

| | | | |
|---|---|---|---|
| 9,054,219 B1 * | 6/2015 | Hoffmann | ....... H01L 21/823431 |
| 9,142,651 B1 | 9/2015 | Xie et al. | |
| 2005/0001273 A1 | 1/2005 | Bryant et al. | |
| 2007/0004107 A1 | 1/2007 | Lee et al. | |
| 2008/0203491 A1 * | 8/2008 | Anderson | ............. H01L 29/785 |
| | | | 257/372 |
| 2008/0265308 A1 | 10/2008 | Lee | |
| 2013/0062699 A1 * | 3/2013 | Zhu | ................... H01L 29/66795 |
| | | | 257/368 |
| 2013/0320294 A1 * | 12/2013 | Cappellani | ........ H01L 29/66439 |
| | | | 257/9 |
| 2014/0124863 A1 | 5/2014 | Cheng et al. | |
| 2014/0159126 A1 * | 6/2014 | Wei | ................... H01L 29/66795 |
| | | | 257/288 |
| 2014/0326952 A1 | 11/2014 | Kuhn et al. | |
| 2015/0028348 A1 | 1/2015 | Jacob et al. | |

FOREIGN PATENT DOCUMENTS

| | | |
|---|---|---|
| CN | 104900498 A | 9/2015 |
| WO | 2017/052601 A1 | 3/2017 |

OTHER PUBLICATIONS

International Preliminary Report on Patentability received for PCT No. PCT/US2015/052280. dated Apr. 5, 2018. 13 pages.

Taiwan Office Action received for TW Application No. 105126785, dated Feb. 24, 2020. 18 pages including translation and Search Report.

* cited by examiner

TECHNIQUES FOR CONTROLLING TRANSISTOR SUB-FIN LEAKAGE

BACKGROUND

A finFET is a transistor built around a thin strip of semiconductor material (generally referred to as the fin). The transistor includes the standard field-effect transistor (FET) nodes, including a gate, a gate dielectric, a source region, and a drain region. The conductive channel of the device resides on the outer portions of the fin adjacent to the gate dielectric. Specifically, current runs along/within both sidewalls of the fin (sides perpendicular to the substrate surface) as well as along the top of the fin (side parallel to the substrate surface). Because the conductive channel of such configurations essentially resides along the three different outer, planar regions of the fin, such a finFET design is sometimes referred to as a tri-gate transistor. Other types of finFET configurations are also available, such as so-called double-gate finFETs, in which the conductive channel principally resides only along the two sidewalls of the fin (and not along the top of the fin). A nanowire transistor (sometimes referred to as a gate-all-around or nanoribbon transistor) is configured similarly to a fin-based transistor, but instead of a finned channel region where the gate is on three portions (and thus, there are three effective gates), one or more nanowires are used and the gate material generally surrounds each nanowire. There exists a number of non-trivial issues associated with fin-based transistors.

BRIEF DESCRIPTION OF THE DRAWINGS

FIGS. 2A'-K' illustrate example integrated circuit structures that are formed when carrying out the method of FIG. 1 on a multilayered substrate including a barrier layer, in accordance with some embodiments of the present disclosure.

DETAILED DESCRIPTION

Figure 1:
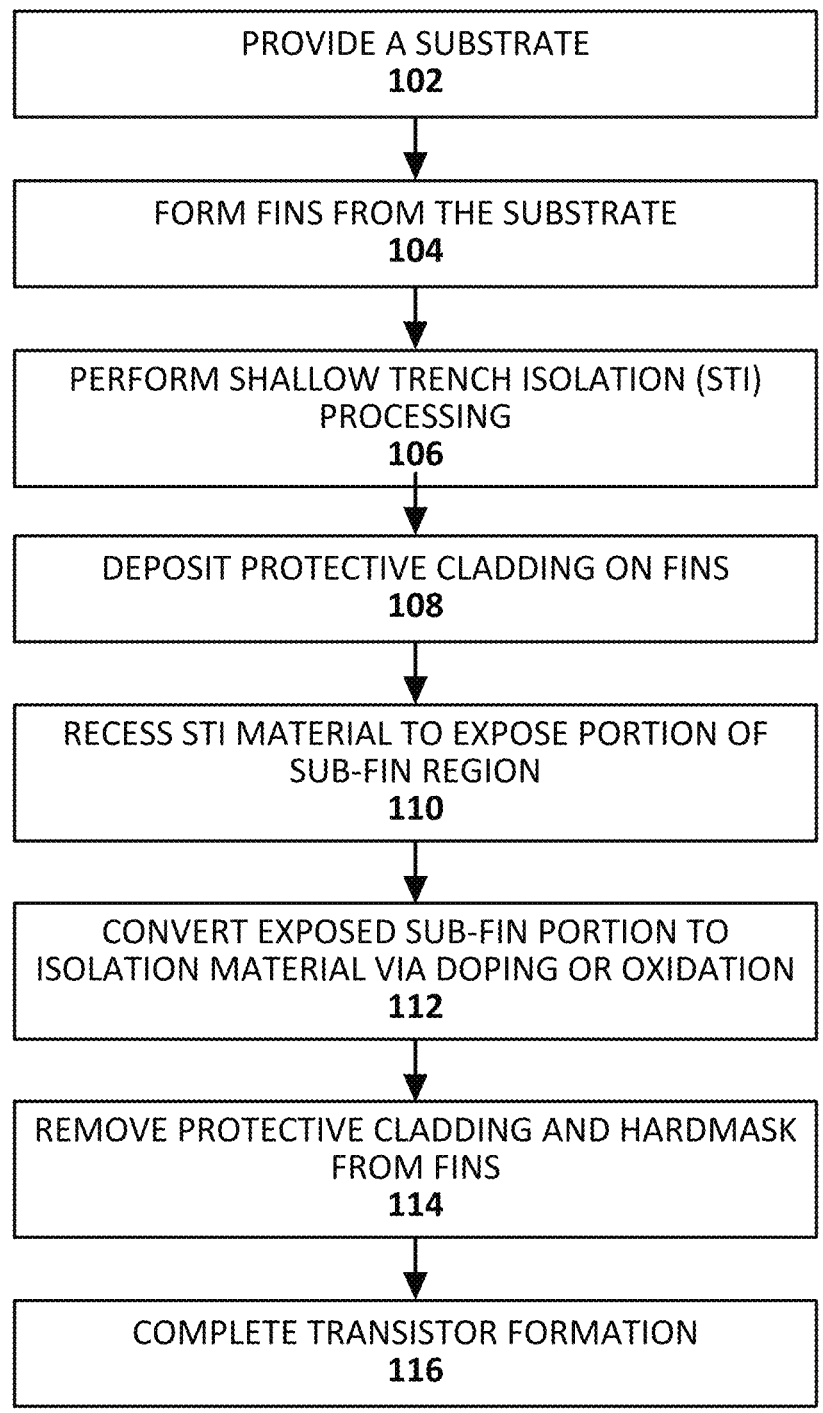
FIG. 1 illustrates a method of forming an integrated circuit, in accordance with some embodiments of the present disclosure.

Techniques are disclosed for controlling transistor sub-fin leakage. The techniques can be used for highly scaled finFETs, as well as other non-planar transistors. In some cases, the techniques include forming at least one fin from a substrate, STI processing and recessing the STI to allow an upper region of the fin to exude from the STI plane, cladding the upper region of the fin, and recessing the STI to expose a portion of the lower region of the fin. The exposed portion of the fin can then be converted to an electrically isolating material via a doping or oxidation process. For example, a monolayer doping (MLD) process may be used to deliver dopants to the exposed portion of the fin in a self-saturated monolayer scheme. In another example case, thermal oxidation (with or without the aid of a catalytic material) may be used to convert the exposed portion to an insulator material. In some cases, a barrier layer (e.g., including carbon doping) may be located above the exposed portion of the fin to help prevent the doping or oxidation process from affecting the upper region of the fin, which is used for the transistor channel. Numerous variations and configurations will be apparent in light of this disclosure.

General Overview

As finFETs scale (e.g., height increases, pitch decreased, etc.), it becomes very challenging to electrically isolate the sub-fin regions of the transistor. Such challenges can lead to an increase in parasitic current flow through the sub-fin regions from source to drain or vice versa, or other leakage issues including to ground. Leakage increases power consumption, and if sufficiently large, leakage can cause complete circuit failure. The current process of using solid source doping to provide a built in diode barrier is limited in its ability to dope and isolate the fine and dense finFET structures. Accordingly, a scalable solution for addressing sub-fin leakage is desired.

Thus, and in accordance with some embodiments of the present disclosure, techniques are disclosed for controlling transistor sub-fin leakage. As will be apparent in light of the present disclosures, the techniques can be used for highly scaled finFETs, as well as other non-planar transistors. In some embodiments, the techniques include forming at least one fin from a substrate, STI processing and recessing the STI to allow an upper region of the fin to exude from the STI plane, cladding the upper region of the fin, and recessing the STI to expose a portion of the lower region of the fin. In some such embodiments, the sub-fin isolation can be achieved by doping or oxidizing the exposed portion of the fin, below the active channel portion. In embodiments where the exposed portion of the fin is doped, a monolayer doping process may be used to deliver dopants in a self-saturated monolayer scheme, for example. Doping, if employed, would be of a similar type (although not necessarily the same species) to the well doping type and counter to the source/drain doping type. However, other doping processes may be used, such as diffusion glass doping, for example. In embodiments where the exposed portion of the fin is oxidized, a thermal oxidation process may be used to oxidize the exposed portion of the fin. In some such embodiments, a catalytic material (e.g., aluminum oxide) may be deposited on the exposed portion of the fins and used during the oxidation process. However, in some embodiments utilizing oxidation, the exposed sub-fin portions may only be thermally treated in a controlled oxidizing environment.

In some embodiments, the fins may be formed from a multilayer substrate including a barrier layer, where the barrier layer in the fins is directly below the active channel portion of the fins. In some such embodiments, the barrier layer may help to completely or partially block the active channel portion from being unintentionally doped or oxidized when the exposed portion of the fin is converted to an isolation portion (e.g., via doping or oxidation as variously described herein). The barrier layer may be a carbon doped epitaxial layer or any other suitable layer, depending on the end use or target application.

Numerous benefits of the techniques will be apparent in light of the present disclosure. For example, the techniques can help realize sub-fin isolation of highly scaled finFETs. Further, the isolation techniques variously described herein are more scalable than other processes, because the sub-fin isolation is performed in a controlled manner (e.g., the techniques include great control of the dopant diffusion and oxidation described herein, particularly where a barrier layer is present). For example, in embodiments where the sub-fin isolation region is achieved through doping, the techniques exhibit monolayer control (e.g., self-limiting chemistry of adsorption) and can achieve high conformal doping in dense non-planar structures. Further, in embodiments where the sub-fin isolation region is achieved through oxidation, the techniques provide more robust isolation vs. other processes, where robustness includes ultimate leakage current and ability to maintain low leakage current in the presence of higher temperature/time thermal processing. In some embodiments, the techniques can be used for transistors having active channel portions including silicon (Si), germanium (Ge), silicon germanium (SiGe), or at least one III-V material (e.g., GaAs, InGaAs, etc.). Various example transistor device geometries can benefit from the isolation techniques described herein including, but not limited to, field-effect transistors (FETs), metal-oxide-semiconductor FETs (MOSFETs), tunnel-FETs (TFETs), planar transistor configurations, dual-gate transistor configurations, finned transistor configurations (e.g., fin-FET, tri-gate), and nanowire (or nanoribbon or gate-all-around) transistor configurations. In addition, the isolation techniques may be used for p-type transistor devices (e.g., p-MOS or p-TFET) and/or n-type transistor devices (e.g., n-MOS or n-TFET). Further, the the isolation techniques may be used for complementary MOS (CMOS) devices or complementary TFET (CTFET) devices. Therefore, the isolation techniques variously described herein allows for continued transistor scaling, including potential future nodes with high mobility channels (such as channels using SiGe or III-V materials), thereby providing continued power/performance scaling with area.

Upon analysis (e.g., using scanning/transmission electron microscopy (SEM/TEM), composition mapping, secondary ion mass spectrometry (SIMS), time-of-flight SIMS (ToF-SIMS), angled ToF-SIMS, atom probe imaging, local electrode atom probe (LEAP) techniques, 3D tomography, high resolution physical or chemical analysis, etc.), a structure or device configured in accordance with some embodiments will effectively show a sub-fin isolation region as variously described herein. For example, such structures may include an isolation region between the active channel and sub-fin regions of a transistor device, where the isolation region is a region that has been doped in the same manner as the active channel but at higher concentrations (e.g., active channel is n-type doped and the isolation region is also n-type doped but at a higher concentration, active channel is p-type doped and the isolation region is also p-type doped but at a higher concentration) or the isolation region is an oxidized region of the original fin. Further, in some embodiments, a barrier layer may be present directly below the active channel region. Such a barrier layer may include, for example, carbon doping (e.g., in the range of 1-30% C content). Further, in some embodiments, use of the isolation techniques and resulting structures variously described herein may be detected by measuring device performance to determine whether one or more of the benefits described herein are realized. Numerous configurations and variations will be apparent in light of this disclosure.

Architecture and Methodology

Figure 2A:
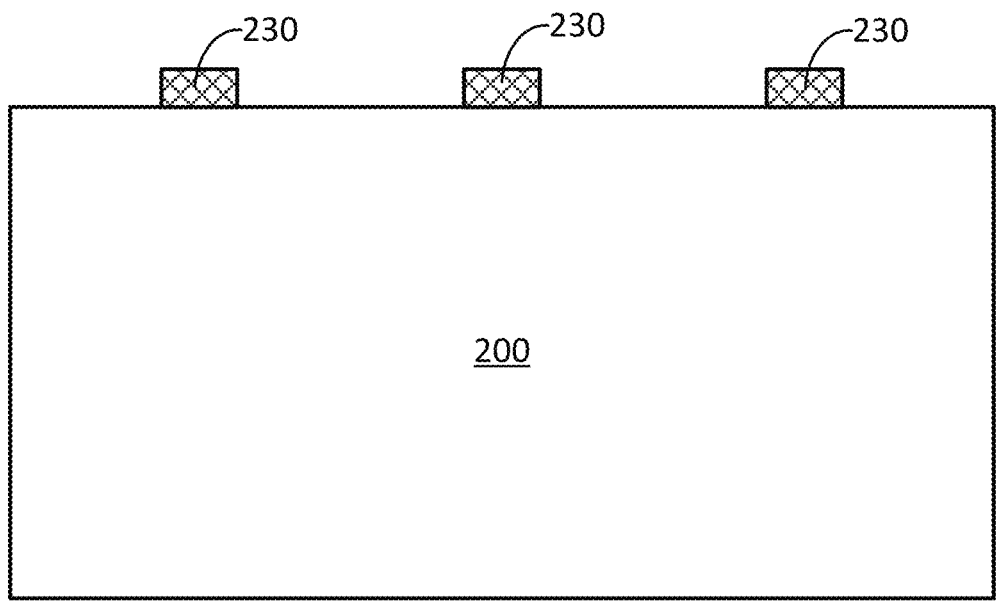
FIGS. 2A-K illustrate example integrated circuit structures that are formed when carrying out the method of FIG. 1, in accordance with some embodiments of the present disclosure.
Figure 2A:
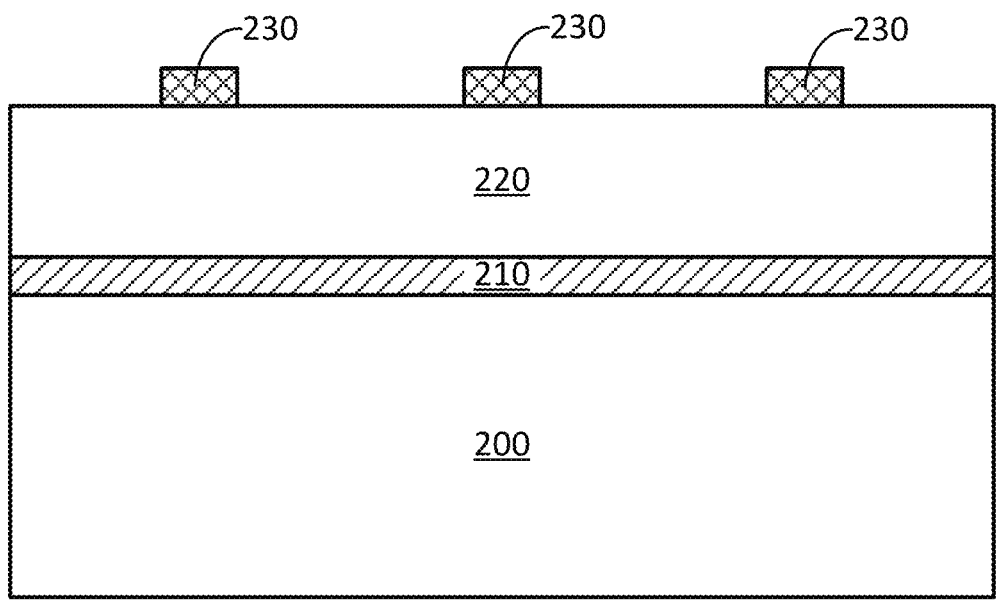

FIG. 1 illustrates a method of forming an integrated circuit, in accordance with some embodiments of the present disclosure. FIGS. 2A-K illustrate example integrated circuit structures that are formed when carrying out the method 100 of FIG. 1, in accordance with some embodiments. FIGS. 2A'-K' illustrate example integrated circuit structures that are formed when carrying out the method 100 of FIG. 1 on a multilayered substrate including a barrier layer, in accordance with some embodiments. As will be apparent in light of the structures formed, method 100 discloses techniques for electrically isolating a transistor active channel from the region below the active channel (referred to herein as a sub-fin or sub-channel region). Accordingly, the structures in FIGS. 2A-J and 2A'-J' are shown at the cross section of the fin in the channel region (e.g., along a plane that will eventually include the transistor gate), as will be apparent when FIGS. 2K-2K' are described. The structures are primarily depicted using transistor devices including a finned configuration (e.g., FinFET or tri-gate) for ease of illustration. However, the techniques can be used to integrate transistors of any suitable geometry, depending on the end use or target application. Various example transistor device geometries that can benefit from the isolation techniques described herein include, but are not limited to, field-effect transistors (FETs), metal-oxide-semiconductor FETs (MOSFETs), tunnel-FETs (TFETs), planar transistor configurations, dual-gate transistor configurations, finned transistor configurations (e.g., fin-FET, tri-gate), and nanowire (or nanoribbon or gate-all-around) transistor configurations. In addition, the isolation techniques may be used for p-type transistor devices (e.g., p-MOS or p-TFET) and/or n-type transistor devices (e.g., n-MOS or n-TFET). Further, the isolation techniques may be used for complementary MOS (CMOS) devices or complementary TFET (CTFET) devices.

Method 100 of FIG. 1 includes providing a substrate 200 as shown in FIG. 2A, in accordance with an embodiment. Substrate 200 may be, for example: a bulk substrate including, e.g., Si, SiGe, Ge, and/or at least one III-V material; an X on insulator (XOI) structure where X is Si, SiGe, Ge, and/or at least one III-V material and the insulator material is an oxide material or dielectric material or some other electrically insulating material; or some other suitable multilayer structure where the top layer includes Si, SiGe, Ge, and/or at least one III-V material. In some embodiments, the top layer may include a plurality of multilayer materials, which may be useful for nanowire applications, for example. As can also be seen in FIG. 2A, hardmask 230 is formed on substrate 200. The hardmask 230 can be deposited using any suitable technique, such as using a blanket depositing or growing the hardmask material 230 on substrate 200 using chemical vapor deposition (CVD), atomic layer deposition (ALD), physical vapor deposition (PVD), spin-on processing, and/or any other suitable process to form hardmask 230 on substrate 200. In some instances, the surface of substrate 200 to be deposited on may be treated (e.g., chemical treatment, thermal treatment, etc.) prior to deposition of hardmask 230. Hardmask 230 can be patterned using any suitable techniques, such as one or more lithography and etch processes, for example. Hardmask 230 may include any suitable material, such as various oxide or nitride materials, for example. Specific oxide and nitride materials may include silicon oxide, titanium oxide, hafnium oxide, aluminum oxide, silicon nitride, or titanium nitride, just to name a few. In some cases, the hardmask material 230 may be selected based on the substrate 200 material used.

In the example embodiment shown in FIG. 2A', the substrate is a multilayer substrate including substrate 200 (which may be a bulk substrate or XOI structure or multilayer structure, as previously described), barrier layer 210, and a top epitaxial layer 220. The multilayer substrate may be formed by depositing barrier layer 210 on substrate 200 and depositing epitaxial layer 220 on barrier layer 210. Such deposition may be performed using, for example, chemical vapor deposition (CVD), atomic layer deposition (ALD), molecular beam epitaxy (MBE), and/or any other suitable process, depending on the end use or target application. Top epitaxial layer 220 may be any suitable semiconductor material (e.g., Si, SiGe, Ge, III-V) or plurality of multilayer materials (e.g., for nanowire applications) and include any desired doping, as layer 220 will be used for the active channel of transistors, as will be described in more detail below. In some embodiments, top epitaxial layer 220 may be the same as or different than substrate material 200. For example, substrate 200 may be a bulk Si wafer and layer 220 may be a Si epitaxial layer. Barrier layer 210 may include any suitable material(s) that helps maintain the high-quality single-crystal structure required for epitaxial layer 220 and also provides some barrier to the active channel from the doping or oxidizing performed for conversion 112 described in more detail below. For example, in cases where conversion 112 includes doping a portion of the fin, the barrier layer 210 may limit or prevent the dopant in the doped portion from diffusing into the active channel. In another example, in cases where conversion 112 includes oxidizing a portion of the fin, the barrier layer may limit or prevent the active channel portion of the fin from being oxidized. In embodiments including Si, Ge, or SiGe active channels (e.g., where epitaxial layer 220 includes Si, Ge, or SiGe), the barrier layer may include carbon (C) doping, such as Si:C with C alloy content of 1 to 30%. Numerous material variations for layers 200, 210, and 220 will be apparent in light of the present disclosure.

Figure 2B:
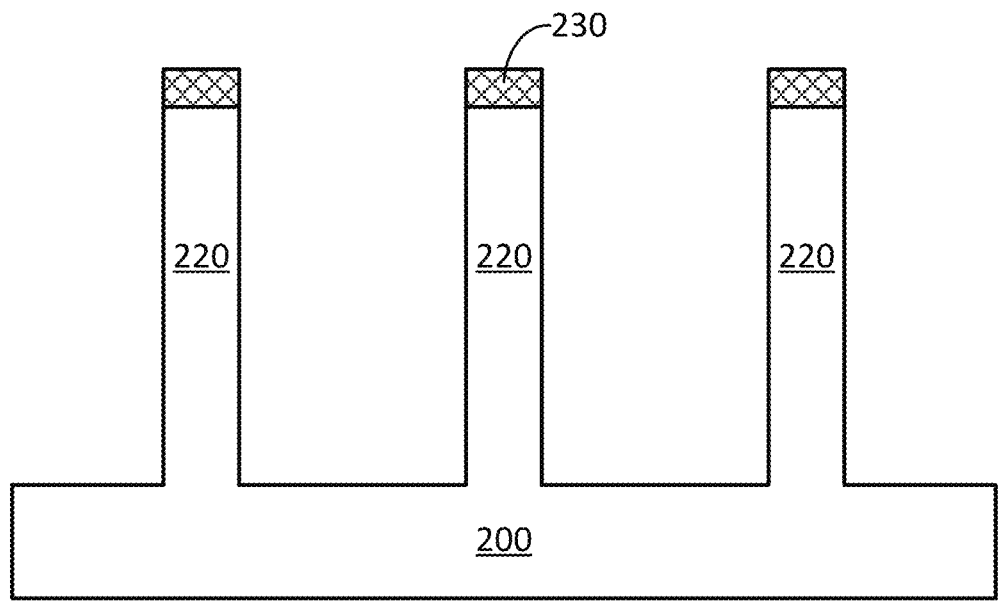
Figure 2B:
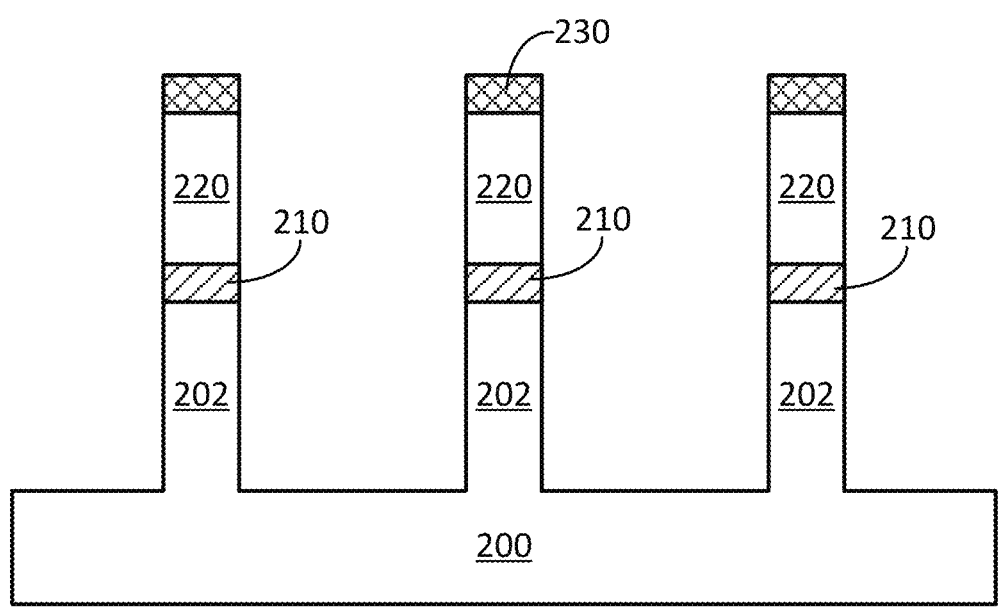

Method 100 of FIG. 1 continues with forming 104 fins from the substrates illustrated in FIGS. 2A and 2A', to form the resulting example structures shown in FIGS. 2B and 2B', respectively, in accordance with some embodiments. Fin formation 104 may include hardmask 230 processing (e.g., as described above), followed by an etch process to remove material from the substrates and form the fins 220 shown in FIG. 2B and the fins 220/210/202 shown in FIG. 2B'. Such a process is also referred to as shallow trench recess. In some embodiments, the fins may be formed to have varying widths and heights. For example, in an aspect ratio trapping (ART) integration scheme, the fins may be formed to have particular height to width ratios such that when they are later removed or recessed, the resulting trenches formed allow for defects in the replacement material deposited to terminate on a side surface as the material grows vertically, such as non-crystalline/dielectric sidewalls, where the sidewalls are sufficiently high relative to the size of the growth area so as to trap most, if not all, of the defects. In such an example case, the height to width ratio (h/w) of the fins may be greater than 1, such as greater than 1.5, 2, or 3, or any other suitable minimum ratio, for example. Note that although only three fins are shown in the example structures of FIGS. 2B and 2B' for illustrative purposes, any number of fins may be formed, such as one, five, ten, hundreds, thousands, millions, etc., depending on the end use or target application. The fins of material other than pure Si can equally be fabricated by blanket deposition and patterning the blanket layer or multilayers into fins. Numerous routes and methods exist to fabricate replacement fins and multilayer fins for nanowire fabrication as known to practitioners of the art.

Figure 2C:
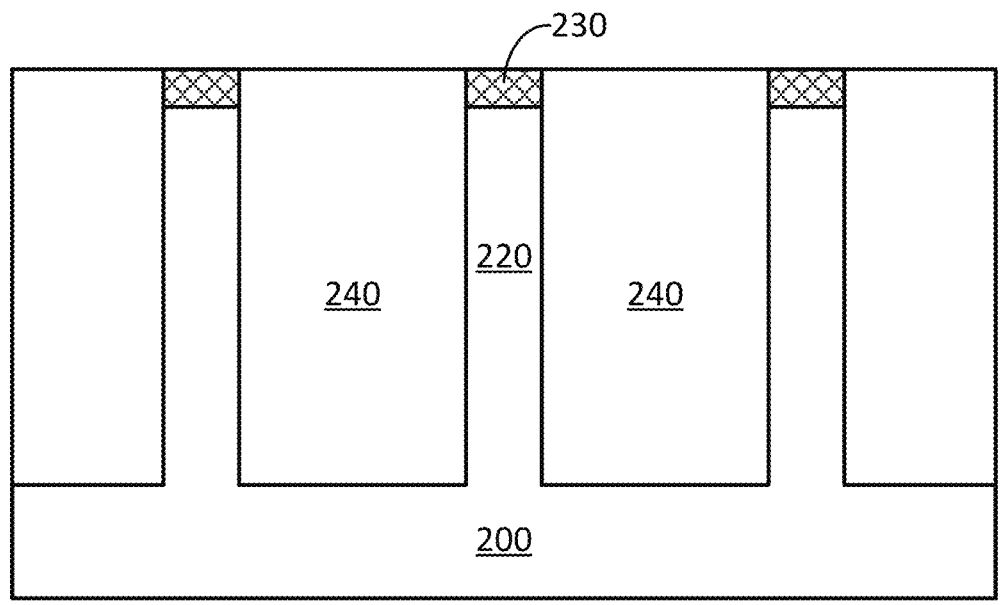
Figure 2C:
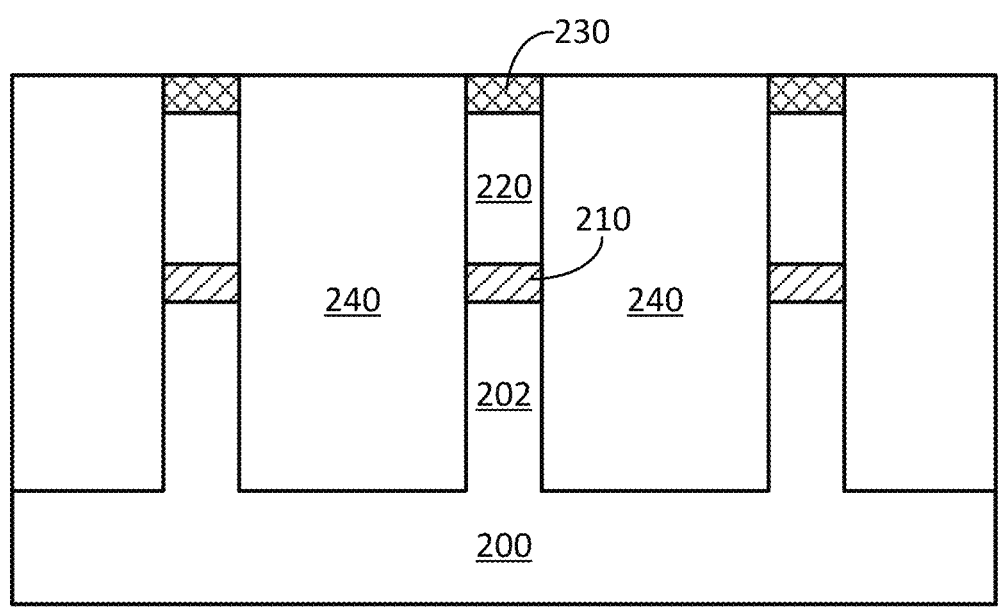
Figure 2D:
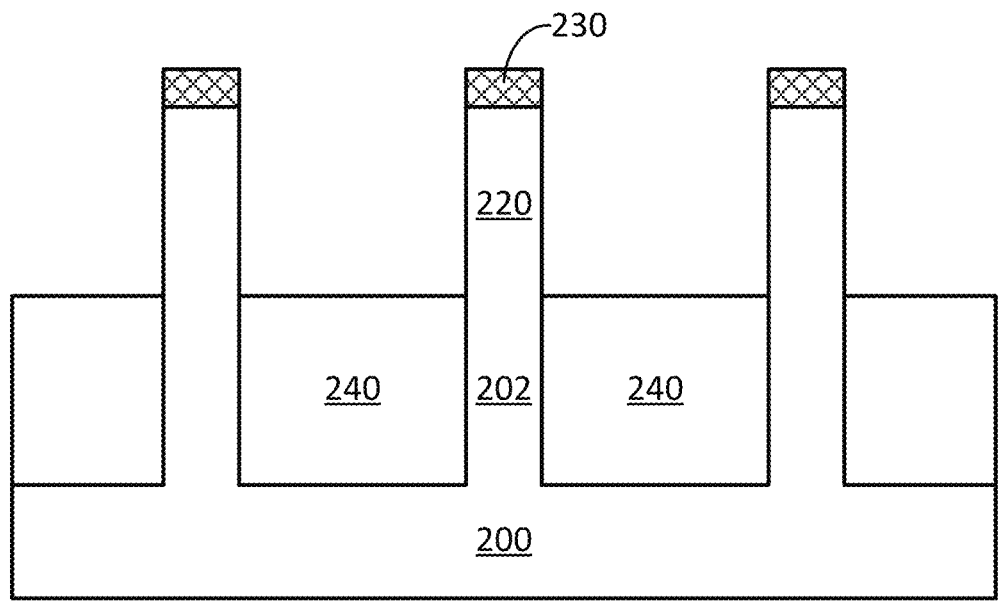
Figure 2D:
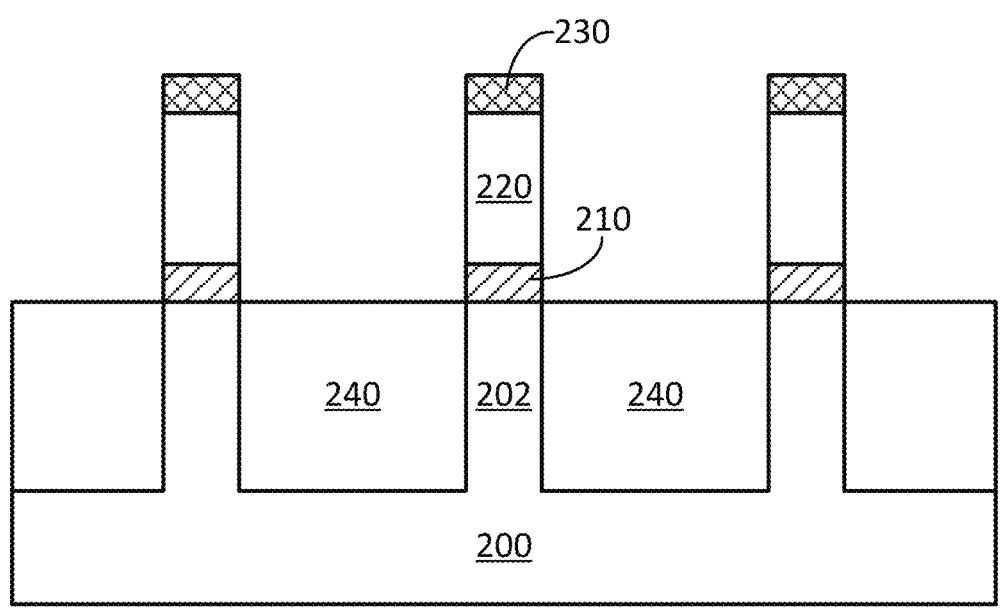

Method 100 of FIG. 1 continues with performing 106 shallow trench isolation (STI) processing to form the example resulting structures of FIGS. 2C-D and 2C'-D', in accordance with some embodiments. As can be seen in FIGS. 2C and 2C', STI material 240 was deposited and the structure was planarized to the level of the hardmask 230. Any suitable deposition process may be used for the STI 240 deposition and the STI material may be selected based on the material of substrate 200 (e.g., to provide appropriate isolation and/or passivation). For example, in the case of a Si substrate 200, STI material 240 may selected to be silicon dioxide or silicon nitride. As can be seen in FIGS. 2D and 2D', the STI material 240 was recessed (e.g., using an oxide etch) to allow for a portion of the fins to exude from the STI plane. In embodiments including barrier layer 210, the oxide etch for the STI recess may be performed to try and align the top of the STI material layer 240 with the bottom of the barrier layer 210, such as is shown in FIG. 2D'. Note that in FIG. 2D', the top of the STI material layer 240 is exactly aligned with the bottom of barrier layer 210 for ease of illustration; however, such a perfect alignment may be difficult to achieve in practice. Therefore, in some cases, it may be desired to err on the side of recessing below barrier layer 210, to help ensure that the cladding deposited in process 108 described in more detail below covers the entirety of the active channel region 220 of the fin 220.

Figure 2E:
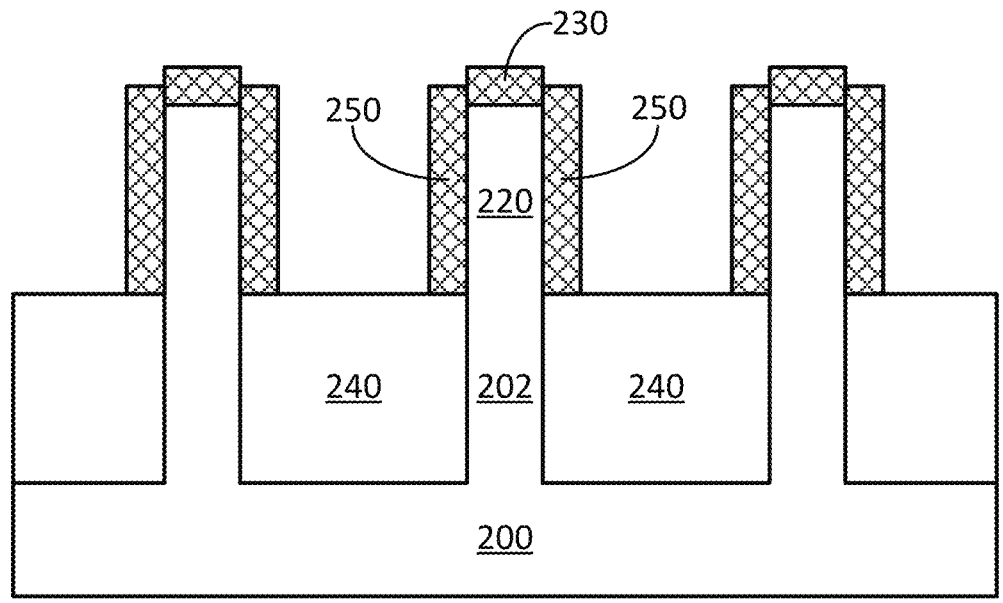
Figure 2E:
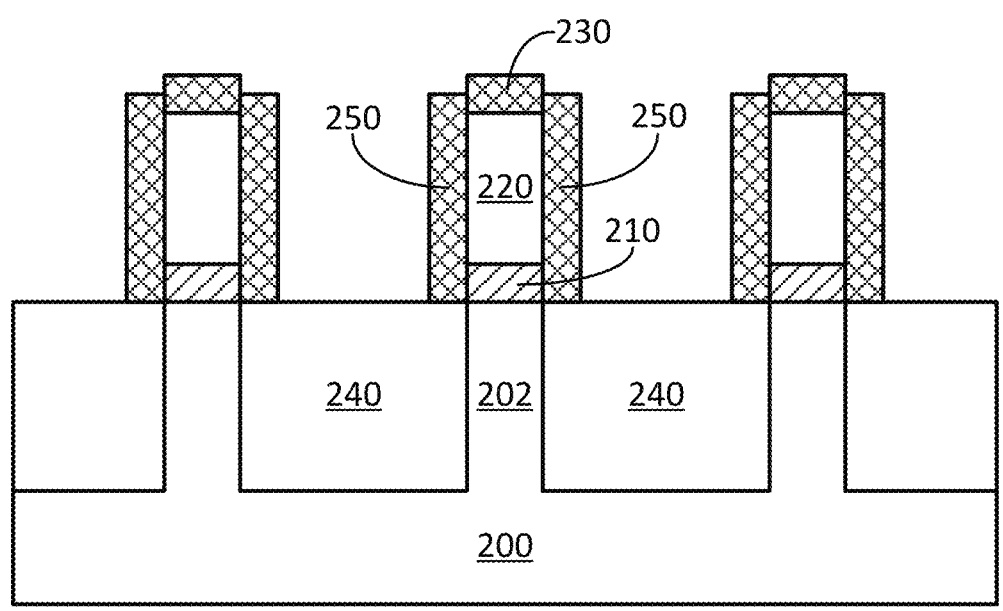

Method 100 of FIG. 1 continues with depositing 108 cladding on the exuded fin portions of the structures of FIGS. 2D and 2D', to form the resulting example structures shown in FIGS. 2E and 2E', respectively, in accordance with some embodiments. Cladding 250 may be deposited 108 using any suitable techniques (e.g., CVD, ALD, etc.) and in some cases, deposition 108 of cladding material 250 may be a selective deposition such that the cladding material 250 only sticks/grows/forms on the material of fin portion 220 or primarily sticks/grows/forms on the material of fin portion 220 (e.g., where atoms of the cladding material 250 stick/grow/form elsewhere, such as in the STI regions 240). Cladding 250 may include any suitable material that protects the active channel region 220 of the fins during the conversion process 112 described in more detail below (e.g., during the doping or oxidizing process). For example, cladding 250 may be formed from the same type of materials that can be used for hardmask 230, such as various oxide or nitride materials. Specific oxide and nitride materials may include silicon oxide, titanium oxide, hafnium oxide, aluminum oxide, silicon nitride, or titanium nitride, just to name a few. In some cases, the cladding material 250 may be selected based on the material of the active channel region 220. Note that in instances where hardmask 230 is removed earlier in the process flow (e.g., during a planarization process performed after STI 240 deposition), hardmask 230 shown in FIGS. 2E and 2E' may instead be cladding material.

Figure 2F:
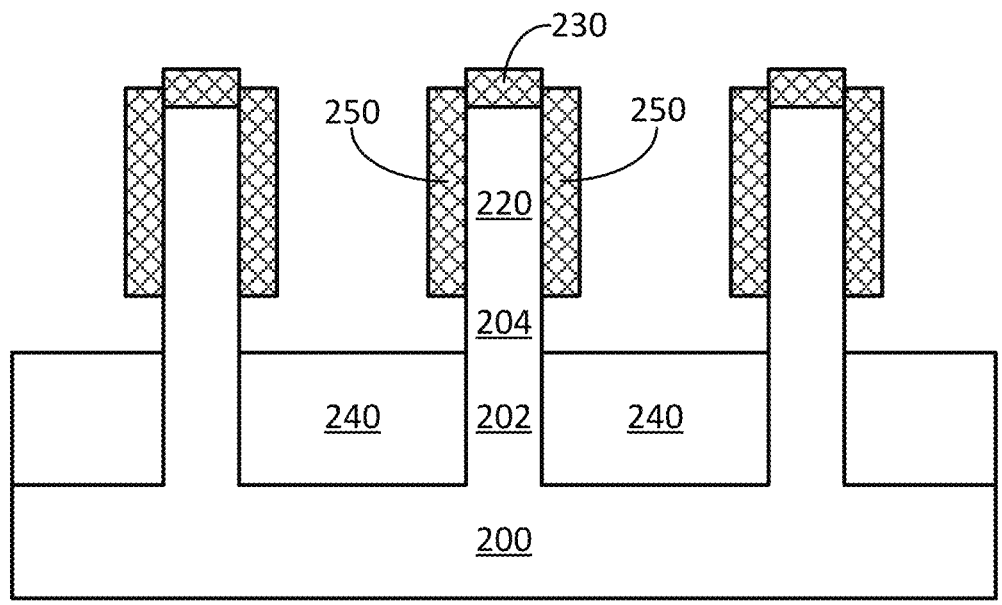
Figure 2F:
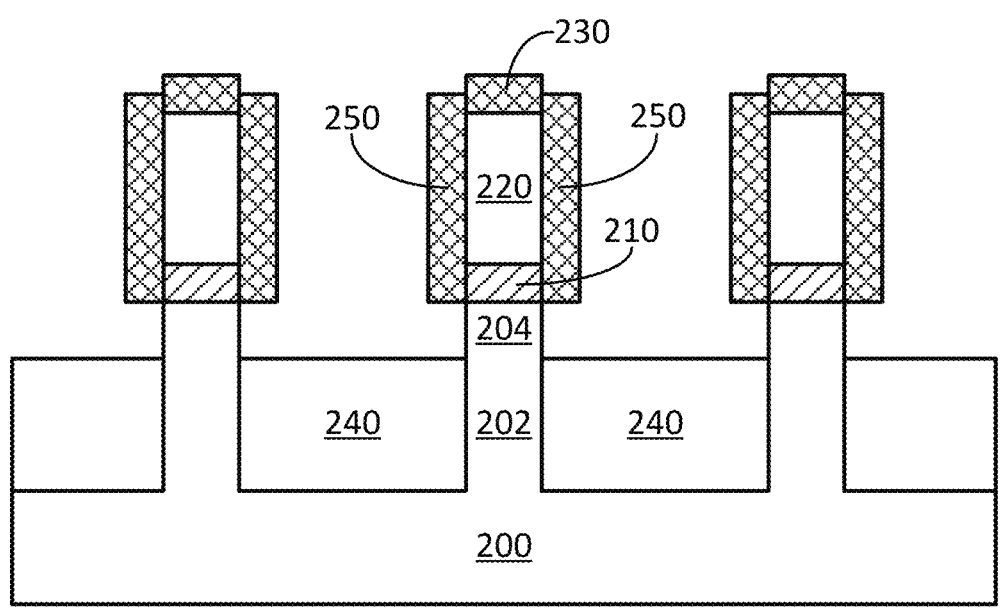
Figure 2G:
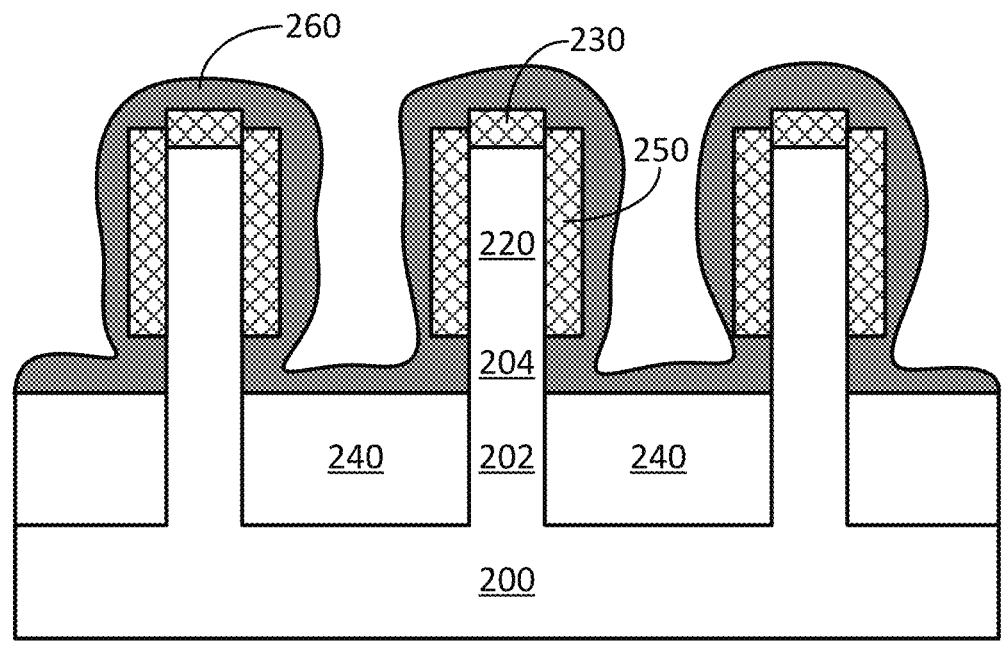
Figure 2G:
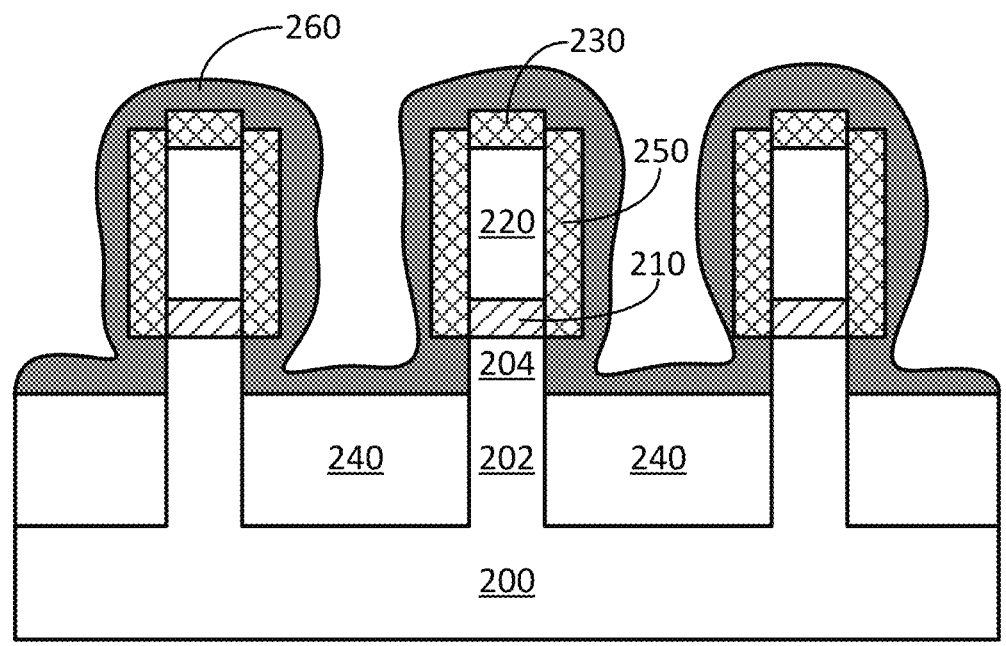

Method 100 of FIG. 1 continues with recessing 110 the STI material 240 in the example structures of FIGS. 2E and 2E' to expose a portion of sub-fin regions of each clad fin in the structures, resulting in the example structures shown in FIGS. 2F and 2F', respectively, in accordance with some embodiments. As can be understood, recess 110 may be considered the second recess of the STI material 240 (e.g., where the first recess of the STI material 240 was performed for the structures of FIGS. 2C and 2C' resulting in the structures of FIGS. 2D and 2D', respectively). Recess 110 may be performed using any suitable process, such as a suitable etch process (e.g., an oxide etch). As can be seen in FIGS. 2F and 2F', recess 110 exposes a portion 204 of the sub-fin region 202, which is the portion 204 that will be doped or oxidized to electrically isolate the active channel region 220 of each fin from the sub-fin region 202, as will be described in more detail below.

Figure 2H:
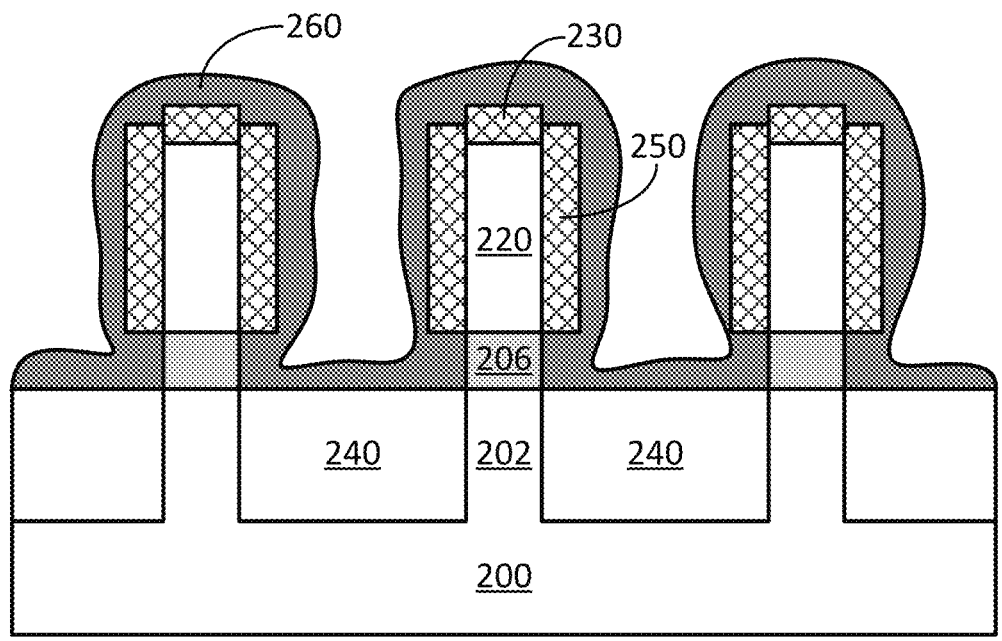
Figure 2H:
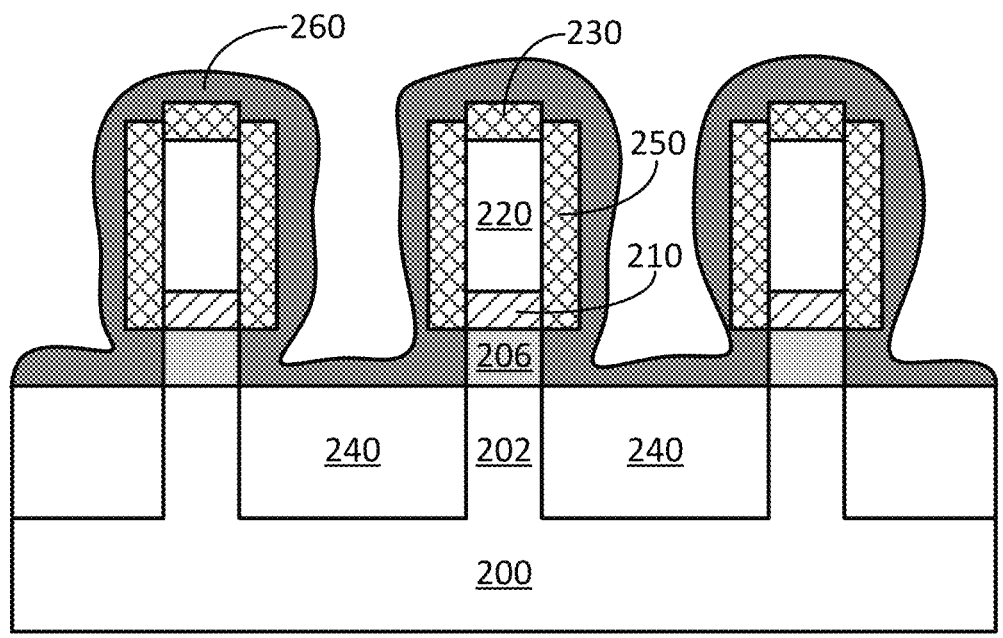
Figure 2I:
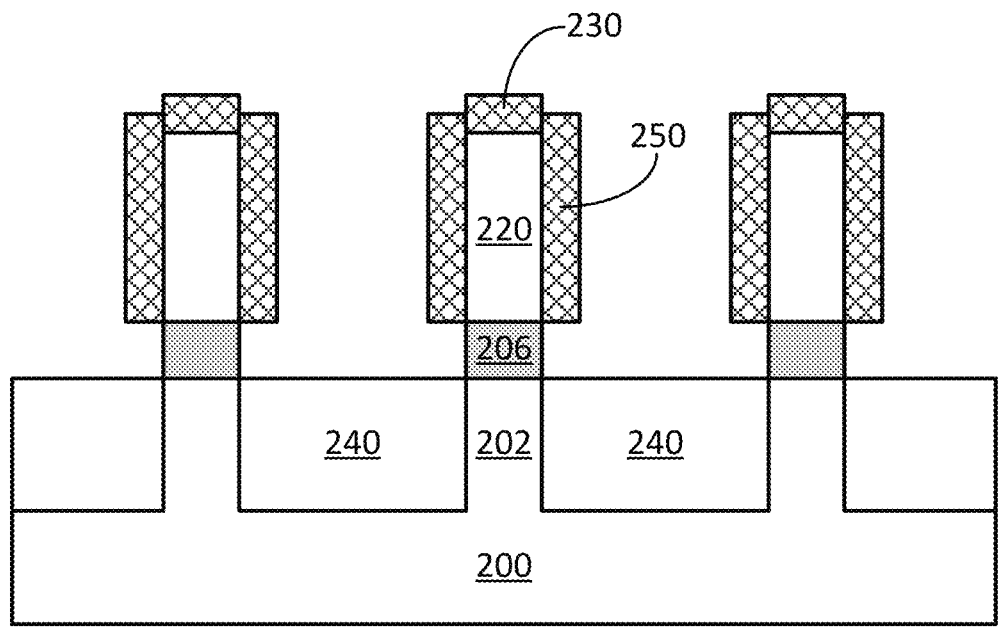
Figure 2I:
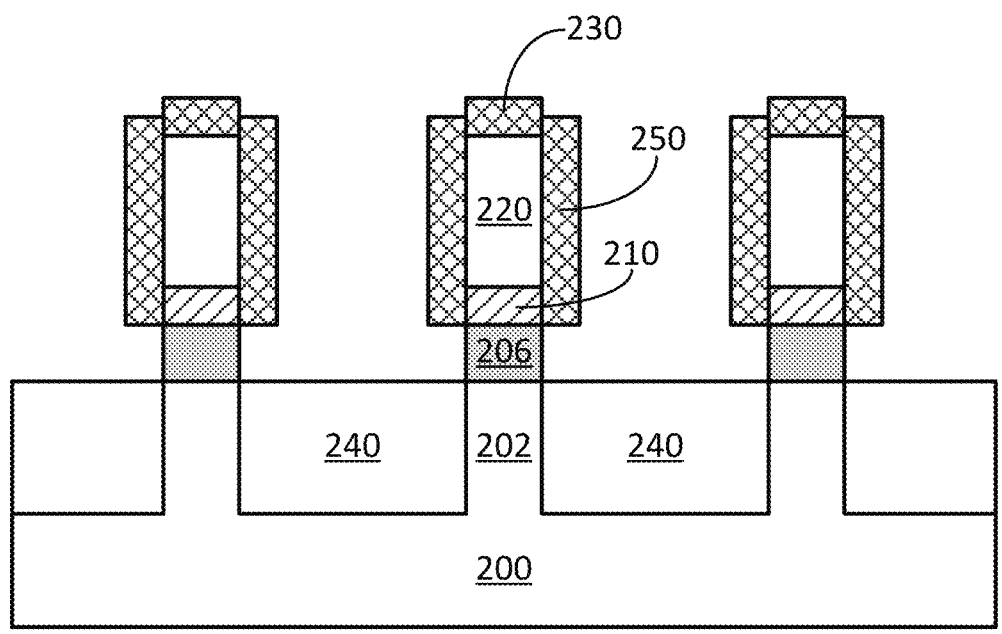

Method 100 of FIG. 1 continues with converting 112 the exposed sub-fin portions 204 to isolation material via doping or oxidation, thereby forming the resulting example structures shown in FIGS. 2I and 2I', in accordance with some embodiments. In some embodiments, the result of the conversion process 112 is that the active channel region 220 of the fins becomes electrically isolated from sub-fin regions 202 (and the substrate 200), where such electrical isolation includes that minimal current (e.g., an order of magnitude below the leakage from the transistor itself in the off-state) leaks from the active channel regions 220 to the sub-fin regions 202 through the converted portions of the fin 206. As will be understood, conversion process 112 may not completely or perfectly electrically isolate active channel regions 220 from sub-fin regions 202, but it will significantly reduce the current that can flow between the regions and thereby help to at least reduce parasitic leakage at that interface (e.g., compared to fins that do not include such isolation). As will be apparent in light of the present disclosure, there are numerous variations on conversion process 112. Doping and oxidation processes that can be used for conversion process 112 will be described in more detail below.

As previously described, in some embodiments, the exposed sub-fin portions 204 can be converted 112 to an electrically isolating material via a monolayer doping (MLD) process. An MLD process for conversion 112 may be beneficial because it is a very controlled doping process that delivers dopants in a self-saturated monolayer scheme that can precisely dope the exposed sub-fin portions 204. Further, where the exposed sub-fin portion 204 is possibly difficult to access, a single monolayer deposition would have a higher chance of accessing that portion (e.g., compared to other deposition techniques) as it is a conformal deposition process. In embodiments using an MLD process, after sub-fin portions 204 are exposed by recess 110, the method 100 can continue by depositing a capping layer 260 over the structures of FIGS. 2F and 2F' to form the resulting example structures shown in FIGS. 2G and 2G', in accordance with some embodiments. The conversion 112 via doping continues with annealing the structures of FIGS. 2G and 2G' to diffuse the dopants from the capping layer 260 into sub-fin portions 204 to form doped sub-fin portions 206 shown in the resulting example structures in FIGS. 2H and 2H', in accordance with some embodiments. As can be understood, the capping layer 260 may include any suitable material that allows for the diffusion of dopants into sub-fin portions 204. In some cases, the capping layer material 260 may be selected based on the end use or target application of the transistor. For example, if the active channel region 220 of the transistor is intended to be an n-type doped channel (e.g., for p-MOS applications), then the MLD process may be used to enhance the sub-fin portion 204 n-type doping 206. Moreover, if the active channel region 220 of the transistor is intended to be a p-type doped channel (e.g., for n-MOS applications), then the MLD process may be used to enhance the sub-fin portion 204 to increase the p-type doping 206. For example, in the case of a Si active channel region that is p-type doped (e.g., boron doped) for an n-MOS application, the MLD process may cause additional p-type dopant (e.g., additional boron doping) to diffuse into the Si sub-fin portion 204 to create the p-type doped sub-fin portion 206. Moreover, in the case of a Si active channel region that is n-type doped (e.g., doped with phosphorous or arsenic) for a p-MOS application, the MLD process may cause additional n-type dopant (e.g., additional phosphorous/arsenic doping) to diffuse into the Si sub-fin portion 204 to create the n-type doped sub-fin portion 206. This enhanced doping under channel (in sub-fin) increases the energy barrier for electrical carriers between source/drain regions and channel to arrest current flow. If the entire channel had been doped at this higher level, the electrical carrier mobility would have suffered, and hence current flow at a given source to drain current value would have been lower. In this manner, a p-n or n-p junction can be enhanced to create an effective electrically isolating boundary (e.g., a diode barrier) during the transistor on-state. As can also be understood, the source (and drain) region and the sub-fin portion 206 would also be a p-n or n-p junction (e.g., a diode barrier) to create an electrically isolating boundary. In some embodiments, other doping processes may be used to convert 112 the exposed sub-fin portions 204 to an electrically isolating material, such as a diffusion glass doping process, for example. Numerous variations on using a doping process to convert 112 the exposed sub-fin portions 204 to isolation material will be apparent in light of the present disclosure.

As was also previously described, in some embodiments, the exposed sub-fin portions 204 can be converted 112 to an electrically isolating material via an oxidation process. In some such embodiments, the oxidation process may be similar to the MLD process described above, where a capping layer 260 is deposited on the structures of FIGS. 2F and 2F' to form the resulting example structures shown in FIGS. 2G and 2G'. However, because conversion 112 is performed via an oxidation process in such embodiments, the capping layer 260 use can be instead a catalytic material, such as aluminum oxide, for example. The oxidation process would continue with thermal treatment to oxidize fin portion 204, resulting in the example structures of FIGS. 2H and 2H', where fin portion 206 is oxidized to electrically isolate the active channel regions 220 from the sub-fin regions 202. As can also be understood, the source region would be electrically isolated from the drain region in the sub-channel region by sub-fin portion 206. In some embodiments, an additional layer may be deposited on the structures of FIGS. 2F and 2F' for purposes of passivation or to increase interface quality. For example, in the case of a Si fin portion 204 to be converted 112, oxidized Si would have low interface trap densities, so additional processing may not be necessary to prevent current leakage at the oxide/semiconductor interface. However, for other cases, such as where fin portion 204 includes Ge and III-V materials, additional passivation anneals or interfacial layers may be used to passivate dangling bonds and/or address interface traps, for example. More specifically, prior to depositing an aluminum oxide capping layer, a layer of aluminum oxide may be deposited to improve interface quality (in terms of interface trap density), for example. In some embodiments, a capping layer 260 may not be used during the oxidation process, and the exposed fin portions 204 shown in FIGS. 2F and 2F' may just be thermally treated to oxidize those portions. Resulting example structures in such embodiments would skip the structures shown in FIGS. 2G-H and 2G'-H', and end up, for example, as the structures shown in FIGS. 2I and 2I'. Note that in some such embodiments, where a catalytic capping layer 260 is not used, higher temperatures, higher pressures, and/or longer times may be required for the thermal treatment to adequately oxidize sub-fin portion 204, depending on the end use or target application.

In embodiments where barrier layer 210 is present, such as is shown in FIGS. 2F'-H', the barrier layer 210 can help protect the active channel region 220 during the conversion process 112. For example, in embodiments where conversion process 112 is a doping process (e.g., a MLD process as described herein), the barrier layer 210 can help to limit the dopant from diffusing into the active channel region 220 during the anneal process. Further, in embodiments where conversion process 112 is an oxidation process, the barrier layer 210 can protect the bottom of active channel region 220 from being oxidized. In some embodiments, at least a portion of the barrier layer 210 may be a part of the active channel region, where charge carriers (e.g., electrons or holes) can flow through both the active channel 220 and barrier layer 210, from the source to the drain. In some embodiments, the barrier layer 210 may provide isolation from sub-fin region 202. As can be understood, although the top of the resulting doped/oxidized portion 206 of the fins in FIG. 2H is shown as being perfectly in line with the bottom of cladding 250, suggesting that no dopant diffused higher than that point and into active channel region 220 or that the oxidation process only oxidized the specific portion 206, that may not be the case in practice. Accordingly, any dopant that unintentionally diffuses into the channel region 220 of the fin or oxidation that occurs in the channel region 220 of the fin will consume effective active fin height due to reduced electrical carrier mobility in the channel where high doping levels are present, which may be undesired. While such issues may be addressed by removing and replacing the active channel material during a replacement gate process (e.g., when the active channel region is exposed after removing the dummy gate), such issues can also be addressed by including barrier layer 210. Regardless, in embodiments where capping layer 260 was used, method 100 may include removing the capping layer 260 after conversion 112 has been performed, resulting in the example structures of FIGS. 2I and 2I', in accordance with some embodiments. Recall that in embodiments where conversion 112 is performed via an oxidation process without a catalytic capping layer 260, the resulting structures would already be the example structures of FIGS. 2I and 2I'.

Figure 2J:
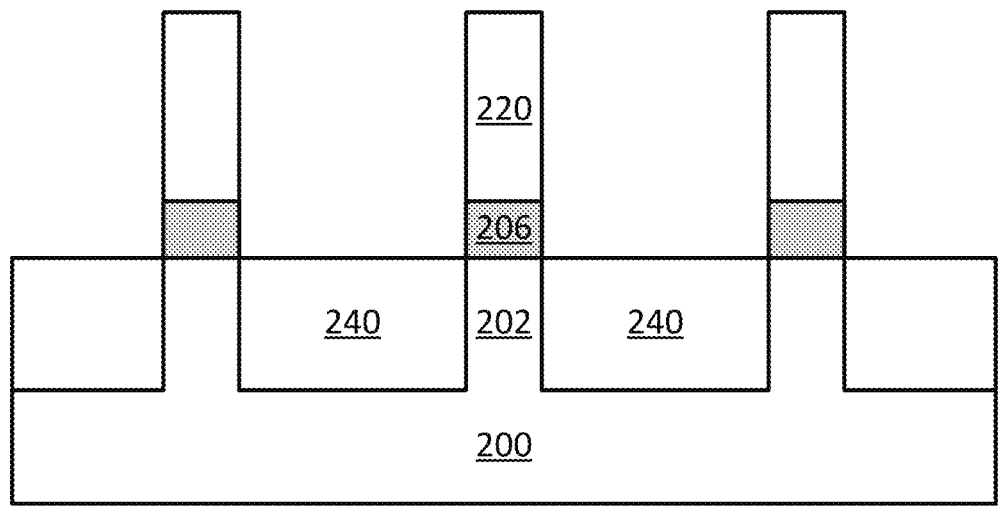
Figure 2J:
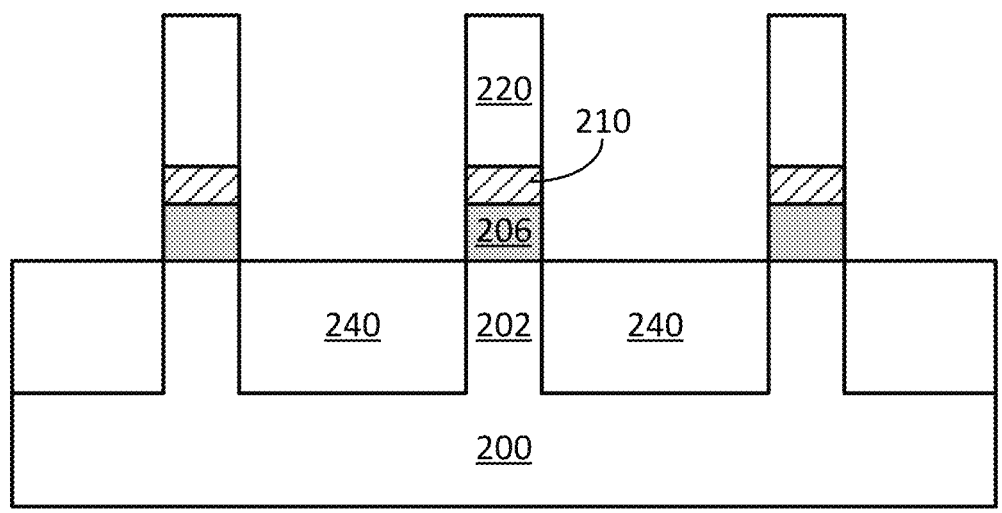

Method 100 of FIG. 1 continues with removing 114 the protective cladding 250 and hardmask 230 from the fins in the structures of FIGS. 2I and 2I', forming the resulting example structures shown in FIGS. 2J and 2J', in accordance with some embodiments. Removal 114 may be performed using any suitable process, such as an etch process that selectively etches the protective cladding 250 and hardmask 230 materials, for example. Accordingly, in some such cases, it may be beneficial to select cladding 250 and hardmask 230 to be formed from the same material, such that only one etch process may be required to remove them both.

Figure 2K:
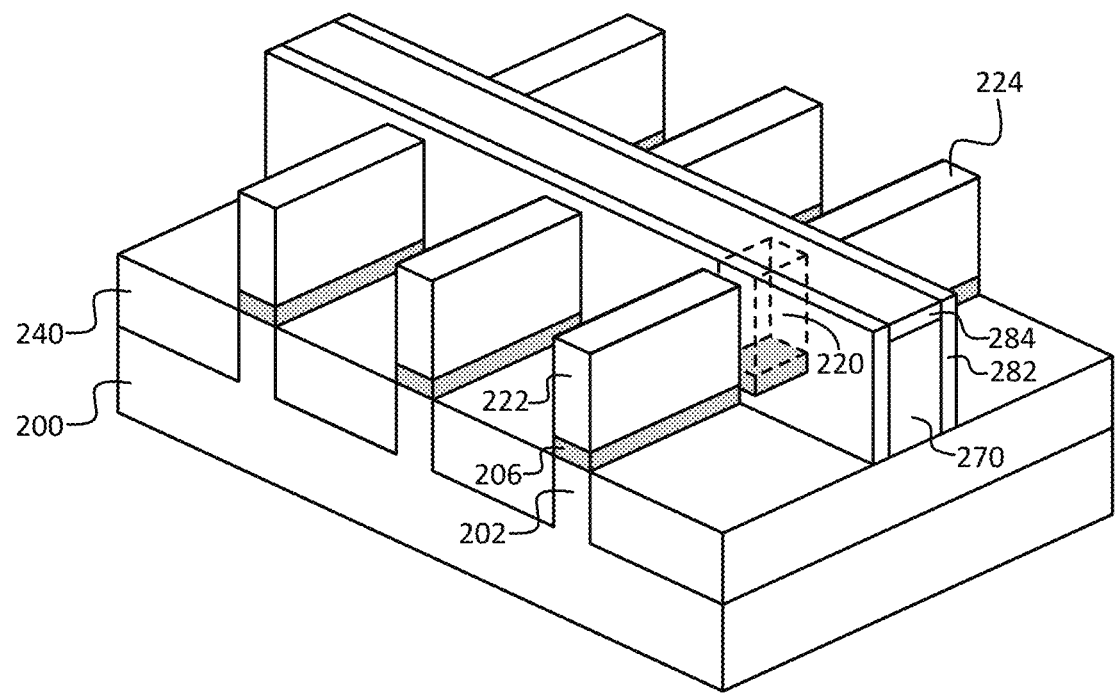
Figure 2K:
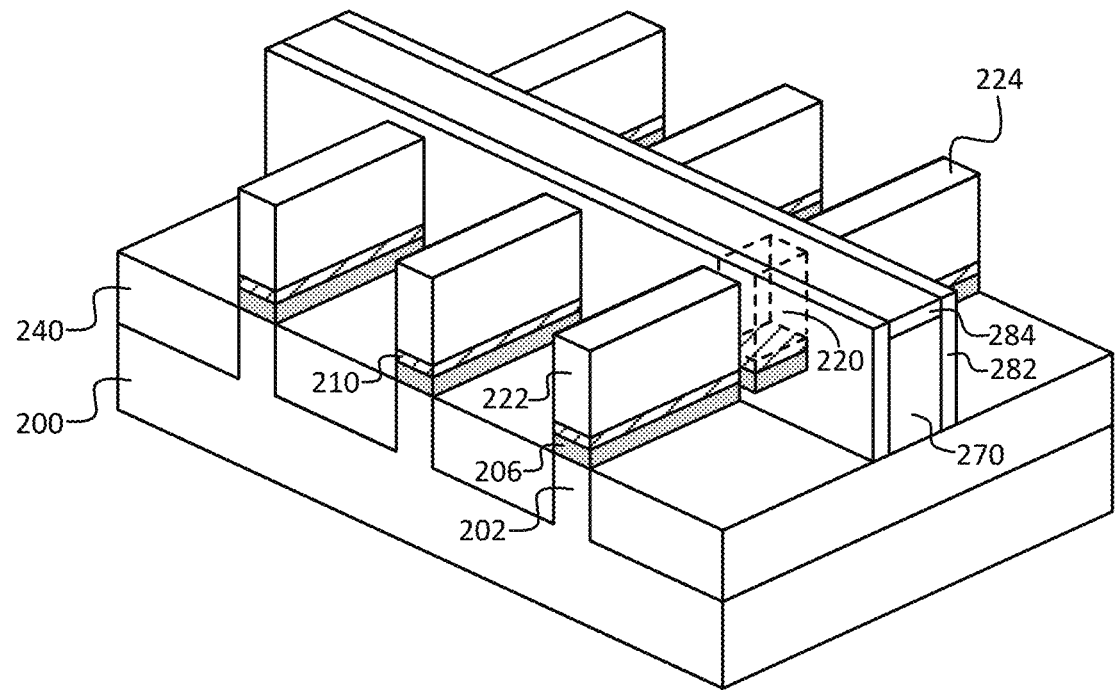

Method 100 of FIG. 1 continues with completing 116 transistor formation, in accordance with some embodiments of the present disclosure. FIGS. 2K and 2K' illustrate the integrated circuit structures of FIGS. 2J and 2J', after gate 270 processing, in accordance with some embodiments. For example, in some embodiments, the formation of gate 270 may include a gate first flow (also called up-front hi-k gate). Further, in other embodiments, the gate 270 may be formed in a gate last flow (also called replacement metal gate (RMG)). In such gate last processing, the process includes dummy gate oxide deposition, dummy gate electrode (e.g., poly-Si) deposition, and patterning hardmask deposition. Additional processing may include patterning the dummy gates and depositing/etching spacer 282 material. Following such processes, the method may continue with insulator deposition, planarization, and then dummy gate electrode and gate oxide removal to expose the channel region of the transistors. Following opening the channel region, the dummy gate oxide and electrode may be replaced with, for example, a hi-k dielectric and a replacement metal gate, respectively.

In this example embodiment, the gate includes a gate electrode 270 and a gate dielectric (not shown for ease of illustration) formed directly under the gate electrode 270. The gate dielectric may be, for example, any suitable oxide such as silicon dioxide or high-k gate dielectric materials. Examples of high-k gate dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used. The gate electrode 270 may comprise a wide range of materials, such as polysilicon, silicon nitride, silicon carbide, or various suitable metals or metal alloys, such as aluminum (Al), tungsten (W), titanium (Ti), tantalum (Ta), copper (Cu), titanium nitride (TiN), or tantalum nitride (TaN), for example. Spacers 282 may be formed adjacent to the gate and/or hardmask 284 may be formed on the gate to, for example, assist with replacement gate processing and/or protect the gate during subsequent processing. As previously described, the structures in FIGS. 2A-J and 2A'-J' were shown at a cross section of the channel region (e.g., at a cross section taken along the gate plane). Accordingly, the active channel 220 is defined by the gate 270 and source/drain (S/D) regions 222/224 are adjacent to the channel 220. Note that either of 222 and 224 may be the transistor source with the other being the drain, depending on the end configuration, for example. Numerous variations on the gate formation will be apparent in light of the present disclosure.

Figure 3:
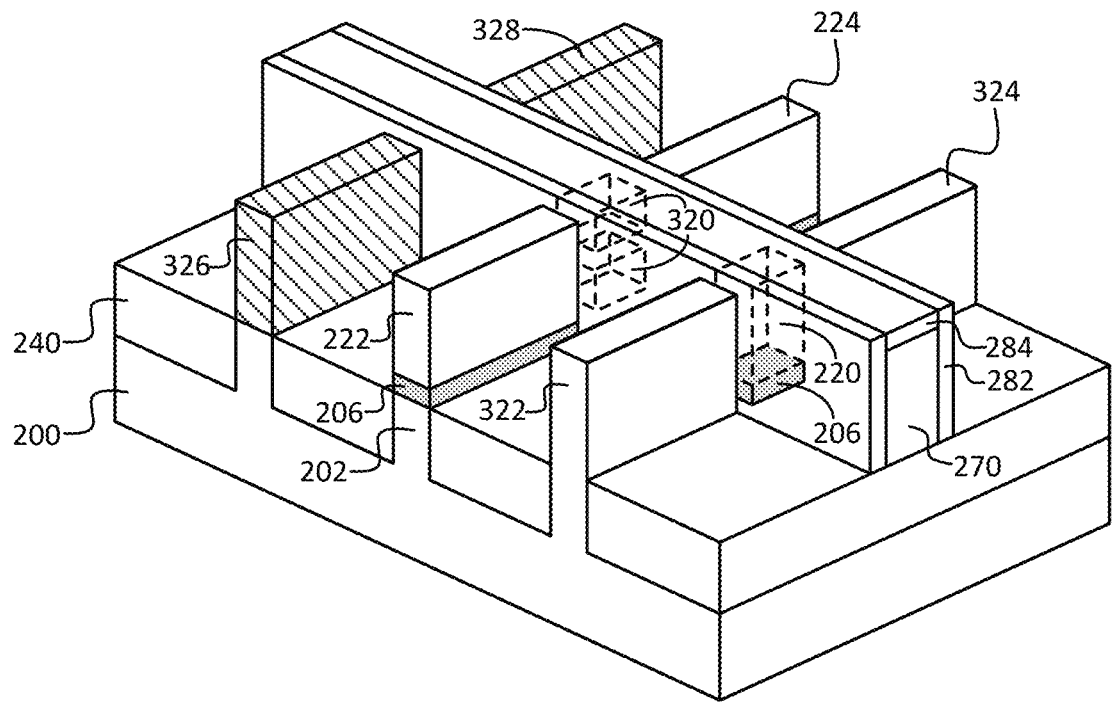
FIGS. 3 and 3' illustrate variations that can be made to the integrated circuit structures of FIGS. 2K and 2K', in accordance with some embodiments of the present disclosure.
Figure 3:
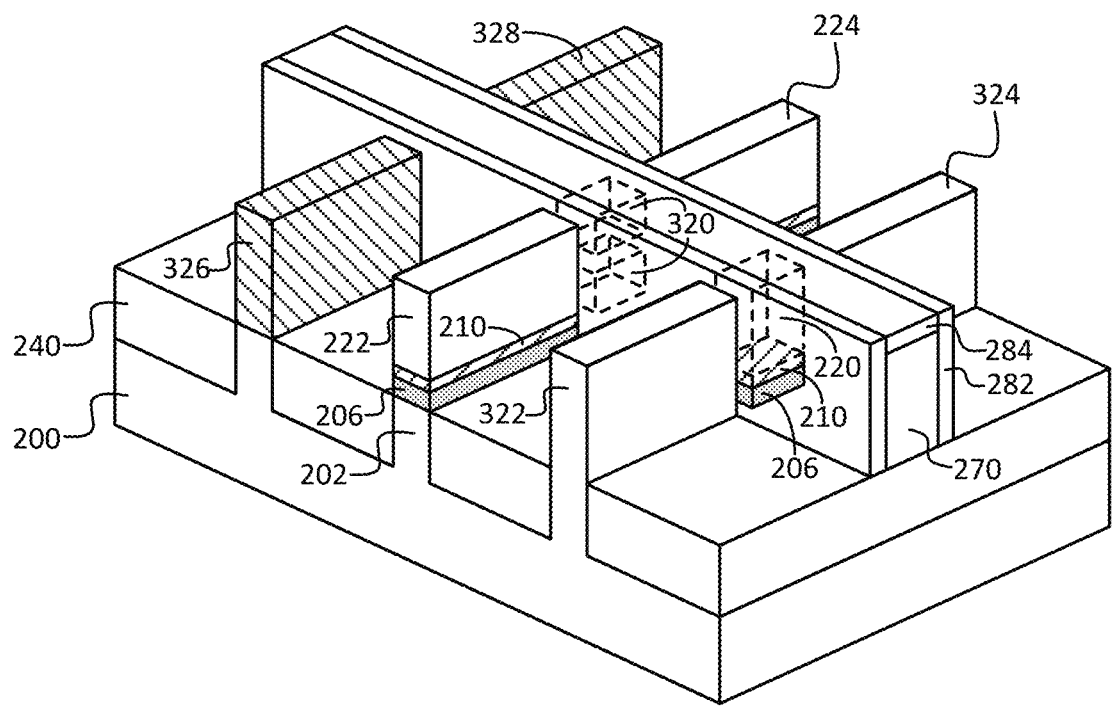

FIGS. 3 and 3' are provided to illustrate numerous variations that can be made to the integrated circuit structures of FIGS. 2K and 2K', in accordance with some embodiments. For example, in some embodiments, completing 116 formation of transistors may include various additional processing. Such additional processing may include tip processing, source/drain processing, isolation oxide processing, contact processing, various other front-end processing, and/or various other back-end processing, for example. For ease of illustration, each of the three fins in FIGS. 3 and 3' are used to illustrate different variations. The right most fin of the example structures in FIGS. 3 and 3' illustrates that the isolation techniques variously described herein may only be performed in the channel region (e.g., during a replacement gate process where the channel region is exposed after the dummy gate is removed), in some embodiments. In such a variation, the S/D regions 322/324 of the fin would not include isolation region 206 (or barrier region 210, where present) and they may remain native to the substrate (e.g., as shown in FIGS. 3 and 3'). As can be understood, the finned channel region 220 in the structures is still present, which can be used to form a finned transistor (e.g., a finFET or tri-gate transistor).

The middle fin of the example structures in FIGS. 3 and 3' illustrates that the isolation techniques can be used with any suitable transistor configuration, such as a nanowire transistor configuration as shown, in some embodiments. A nanowire transistor (sometimes referred to as a gate-all-around or nanoribbon transistor) is configured similarly to a fin-based transistor, but instead of a finned channel region where the gate is on three sides (and thus, there are three effective gates), one or more nanowires are used and the gate material generally surrounds each nanowire on all sides. Depending on the particular design, some nanowire transistors have, for example, four effective gates. As can be seen in the example structure of FIGS. 3 and 3', the channel regions each have two nanowires 320, although other embodiments can have any number of nanowires. The nanowires 320 may have been formed while the channel regions were exposed during a replacement gate process (e.g., an RMG process), after the dummy gate is removed, for example. Note that the underlying isolation regions 206 (and barrier regions 210, in the case of FIG. 3') would also be present below the nanowires 320 (as they are shown present below S/D regions 222/224); however, they are not shown in the channel region for ease of illustration. Therefore, even such nanowire structures can benefit from the isolation techniques variously described herein. Note that any combination of transistor configurations may be used for a single integrated circuit, including planar, dual gate, finned (or tri-gate or FinFET), nanowire (or nanoribbon or gate-all-around), and/or any other suitable transistor configuration, depending on the end use or target application, and that all such configurations can benefit from the isolation techniques variously described herein.

The left fin of the example structures in FIGS. 3 and 3' illustrate that the S/D regions 222/224 may be removed and replaced with epitaxial S/D material 326/328, in some embodiments. As can be seen, the upper portion of the S/D 222/224 and the isolation region 206 (as well as the barrier layer 210, in the example embodiment of FIG. 3') was removed during S/D processing (e.g., after a dummy gate is deposited to establish the channel and S/D regions) using any suitable process, such as an etch process, for example. After the removal, the fin was replaced with epitaxial material 326/328, while the channel may remain the same (and look similar to the channel regions of the right fins in FIGS. 3 and 3'). Such a removal and replacement of the S/D regions with epitaxial material may be performed for various reasons, such as to achieve the desired transistor configuration (e.g., p-MOS or n-MOS), or to help reduce resistance at varying locations (e.g., at the metal contact interface). Another alternate embodiment consists of a buried layer of doped epi material either with or without carbon, either co-doped with the carbon layers or bound by carbon layers on one or both sides. This could involve masking and growth of a p-type region followed by re-masking and growth of an n-type region. It could also involve a single doping species and driving out the dopant where it is undesired. Such a dopant loss method may be performed in the following manner: in locations where dopant is desired, it is sealed in with a cladding insulator layer and regions where the dopant is undesired would be left exposed during a forming gas or hydrogen anneal, for example. Such an alternate embodiment may be particularly effective for n-type dopants that have high vapor pressure at elevated temperatures, for example.

The integrated circuit structures shown in FIGS. 2A-K, 2A'-K', and 3-3' are provided as examples and are not intended to limit the present disclosure. Note that each individual fin shown in the structures variously described herein may be used for a separate transistor device or used in combination with one or more other fins to form a transistor device, depending on the end use or target application. For example, a portion of fins may be masked off at any suitable point in method 100, such that conversion 112 is only performed on the non-masked off fins, followed by masking off the converted fins and performing conversion 112 on the remaining fins. In such an example case, different conversion processes can be performed for different fins, which may allow fins to be used for p-MOS to be isolated with one doping scheme and allow fins to be used for n-MOS to be isolated with another doping scheme, for example. The masking/conversion can be repeated as many times as desired to achieve fins having varied material in the isolation regions 206 described herein. Also note that doping of the transistor channel material, when performed, may occur at any suitable stage of the transistor formation process. Further note that the isolation techniques as variously described herein may be used with devices of varying scales, such as transistor devices in the micrometer range or transistor devices in the nanometer range (e.g., transistors formed at the 22, 14, 10, 7, or 5 nm process nodes). Numerous variations and configurations will be apparent in light of the preset disclosure.

Example System

Figure 4:
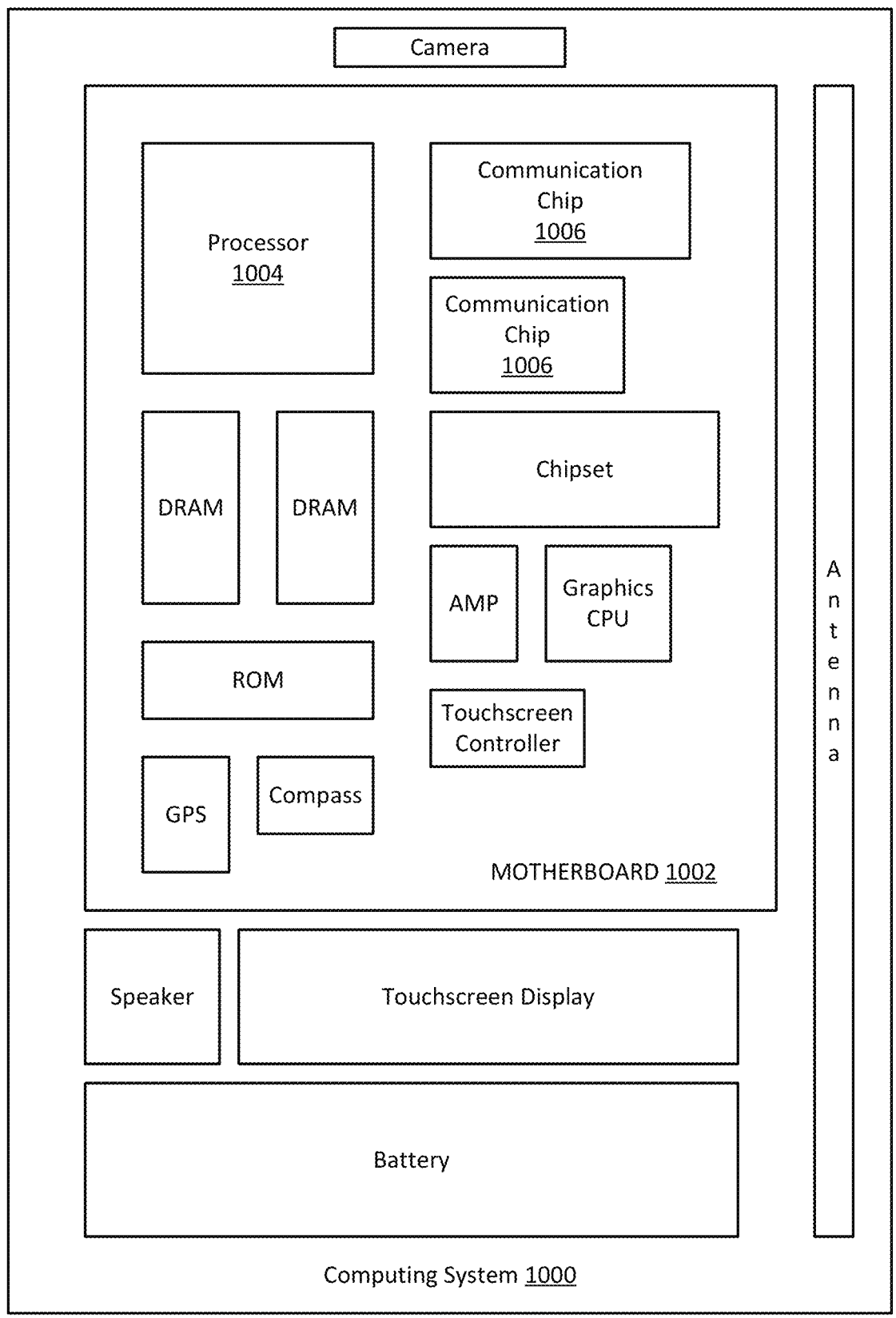
FIG. 4 illustrates a computing system implemented with integrated circuit structures or devices formed using the techniques described herein, in accordance with an embodiment of the present disclosure.

FIG. 4 illustrates a computing system 1000 implemented with integrated circuit structures or devices formed using the techniques disclosed herein, in accordance with an example embodiment. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc.

Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices formed using the disclosed techniques in accordance with an example embodiment. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments, the integrated circuit die of the processor includes onboard circuitry that is implemented with one or more integrated circuit structures or devices formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices formed using the disclosed techniques as variously described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing device 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

Further Example Embodiments

The following examples pertain to further embodiments, from which numerous permutations and configurations will be apparent.

Example 1 is a transistor including: a substrate having a fin extending therefrom, wherein the fin includes a channel and a sub-fin region below the channel; a gate located over the fin and adjacent the channel; and source and drain regions adjacent the channel; wherein at least a portion of the sub-fin region is one of doped the same type as the channel and an insulator material. As can be understood based on the present disclosure, in some cases, the portion of the sub-fin region (being, e.g., doped or oxidized) electrically isolates the source region from the drain region in the sub-fin region. As can also be understood based on the present disclosure, in some cases, the portion of the sub-fin region electrically isolates the channel from the sub-fin region during the transistor on-state.

Example 2 includes the subject matter of Example 1, wherein the portion of the sub-fin region extends under the source and drain regions.

Example 3 includes the subject matter of any of Examples 1-2, wherein the portion of the sub-fin region is doped at a higher concentration than the channel.

Example 4 includes the subject matter of any of Examples 1-3, wherein the channel material is native to the substrate.

Example 5 includes the subject matter of any of Examples 1-4, wherein the channel is electrically isolated from the sub-fin region during the transistor on-state based on the portion of the sub-fin region being doped.

Example 6 includes the subject matter of any of Examples 1-5, wherein one of a p-n and n-p junction is located at the interface of the channel and the sub-fin region during the transistor on-state.

Example 7 includes the subject matter of any of Examples 1-4, wherein the channel is electrically isolated from the sub-fin region during the transistor on-state based on the portion of the sub-fin region including oxidation.

Example 8 includes the subject matter of any of Examples 1-7, wherein a carbon-doped layer is located between the channel and the portion of the sub-fin region.

Example 9 includes the subject matter of any of Examples 1-8, wherein the channel includes at least one of silicon, germanium, silicon germanium, and a III-V material.

Example 10 includes the subject matter of any of Examples 1-9, wherein the channel has a finned configuration.

Example 11 includes the subject matter of any of Examples 1-10, wherein the channel has a nanowire configuration including at least one nanowire.

Example 12 includes the subject matter of any of Examples 1-11, wherein the transistor is one of a p-type and n-type transistor.

Example 13 is a complementary metal-oxide-semiconductor (CMOS) device including the subject matter of any of Examples 1-12.

Example 14 is a computing system including the subject matter of any of Examples 1-13.

Example 15 is an integrated circuit including: a substrate; a fin at least one of on and native to the substrate, the fin including a lower region and an upper region, the fin further including an isolation region between the lower and upper region; and a transistor including; a channel in at least a portion of the upper region of the fin; and source and drain regions adjacent the channel; wherein the isolation region electrically isolates the source and drain regions.

Example 16 includes the subject matter of Example 15, wherein the isolation region extends under the source and drain regions, and wherein the isolation region is between the source and drain regions and the substrate.

Example 17 includes the subject matter of any of Examples 15-16, wherein at least the lower region of the fin is native to the substrate.

Example 18 includes the subject matter of any of Examples 15-17, wherein the upper region of the fin is native to the substrate.

Example 19 includes the subject matter of any of Examples 15-18, wherein the isolation region is doped in the same type and at a higher concentration than the upper region of the fin.

Example 20 includes the subject matter of any of Examples 15-19, wherein the isolation region and the upper region of the fin are one of a p-n and n-p junction during the transistor on-state.

Example 21 includes the subject matter of any of Examples 15-20, wherein the isolation region includes oxidation.

Example 22 includes the subject matter of any of Examples 15-21, wherein a carbon-doped layer is located between the upper region of the fin and the isolation region.

Example 23 includes the subject matter of any of Examples 15-22, wherein the upper region of the fin includes at least one of silicon, germanium, silicon germanium, and a III-V material.

Example 24 includes the subject matter of any of Examples 15-23, wherein the transistor channel has a finned configuration.

Example 25 includes the subject matter of any of Examples 15-24, wherein the transistor channel has a nanowire configuration including at least one nanowire.

Example 26 includes the subject matter of any of Examples 15-25, wherein the transistor is one of a p-type and n-type transistor.

Example 27 is a complementary metal-oxide-semiconductor (CMOS) device including the subject matter of any of Examples 15-26.

Example 28 is a computing system including the subject matter of any of Examples 15-27.

Example 29 is a method of forming at transistor, the method including: providing a substrate; forming a fin from the substrate; depositing shallow trench isolation (STI) material; recessing the STI material to allow an upper region of the fin to exude from the top of the STI material, wherein a lower region of the fin is below the top of the STI material; depositing cladding material on the upper region of the fins; recessing the STI material to expose a portion of the lower region of the fin; and converting the exposed portion of the lower region of the fin to isolation material via one of a doping and oxidation process, wherein the isolation material electrically isolates the upper region of the fin from the lower region of the fin.

Example 30 includes the subject matter of Example 29, wherein the exposed portion of the lower region of the fin is converted to an isolation material via a monolayer doping process.

Example 31 includes the subject matter of Example 29, wherein the exposed portion of the lower region of the fin is converted to an isolation material via a diffusion glass doping process.

Example 32 includes the subject matter of any of Examples 29-31, wherein the exposed portion of the lower region of the fin is doped in the same type and at a higher concentration than the upper region of the fin.

Example 33 includes the subject matter of Example 29, wherein the exposed portion of the lower region of the fin is converted to an isolation material via an oxidation process.

Example 34 includes the subject matter of Example 33, wherein the oxidation process includes depositing a catalytic material on the exposed portion of the lower region of the fin.

Example 35 includes the subject matter of any of Examples 29-34, wherein the substrate is a multilayer substrate including a barrier layer sandwiched between a bottom layer and a top layer.

Example 36 includes the subject matter of Example 35, wherein the barrier layer includes a carbon doped material.

Example 37 includes the subject matter of any of Examples 35-36, wherein the exposed portion of the lower region of the fin is below the barrier layer.

Example 38 includes the subject matter of any of Examples 29-37, wherein the fin includes at least one of silicon, germanium, silicon germanium, and a III-V material.

Example 39 includes the subject matter of any of Examples 29-38, wherein the transistor is one of a p-type and n-type transistor.

Example 40 includes the subject matter of any of Examples 29-39, wherein the transistor geometry includes at least one of a field-effect transistor (FET), metal-oxide-semiconductor FET (MOSFET), tunnel-FET (TFET), finned configuration, finFET configuration, tri-gate configuration, nanowire configuration, nanoribbon configuration, and gate-all-around configuration.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. An integrated circuit including at least one transistor, the integrated circuit comprising:
    a substrate;
    a fin extending above the substrate, the fin including an upper portion, an intermediate portion, and a lower portion, the upper and lower portions including semiconductor material that is native to the substrate, and the intermediate portion being either (1) an oxide of the semiconductor material or (2) the semiconductor material having an impurity dopant concentration higher than any impurity dopant concentration of the upper portion;
    a gate structure at least on top and side surfaces of the upper portion, the gate structure including a gate electrode and a gate dielectric, the gate dielectric between the upper portion and the gate electrode;
    a source region and a drain region, the upper portion of the fin between the source and drain regions; and
    first and second insulator structures each on the substrate and laterally adjacent to a respective side of the lower portion of the fin, the first and second insulator structures including an insulator material, the insulator material in contact with the semiconductor material of the lower portion.

2. The integrated circuit of claim 1, wherein the semiconductor material includes germanium.

3. The integrated circuit of claim 1, wherein the semiconductor material includes group III-V semiconductor material.

4. The integrated circuit of claim 1, wherein the upper portion includes no or minimal impurity dopant.

5. The integrated circuit of claim 1, wherein the intermediate and lower portions of the fin are below the source and drain regions in addition to being below the gate structure.

6. The integrated circuit of claim 1, wherein at least a portion of the intermediate portion is between portions of the gate structure.

7. The integrated circuit of claim 1, wherein the fin further includes a layer between the upper portion and the intermediate portion, the layer including the semiconductor material and carbon.

8. A complementary metal-oxide-semiconductor (CMOS) circuit comprising the integrated circuit of claim 1.

9. A computing system comprising the at least one transistor of claim 1.

10. An integrated circuit including at least one transistor, the integrated circuit comprising:

a fin extending from a substrate, the fin including a lower region and an upper region, the fin further including an isolation region between the lower and upper regions, wherein the lower and upper regions include semiconductor material, and wherein the isolation region includes an oxide of the semiconductor material;

a layer between the upper region of the fin and the isolation region, the layer including carbon;

a gate structure at least over the upper region of the fin, the gate structure including a gate electrode and a gate dielectric, the gate dielectric between the upper region of the fin and the gate electrode; and a source region and a drain region, the upper region of the fin between the source and drain regions, wherein the source and drain regions include semiconductor material.

11. The integrated circuit of claim 10, wherein the isolation region extends under the source and drain regions, such that the isolation region is between the source region and the lower region of the fin, and the isolation region is also between the drain region and the lower region of the fin.

12. The integrated circuit of claim 11, wherein the layer extends under the source and drain regions, such that the isolation region is between the layer and the lower region of the fin.

13. The integrated circuit of claim 10, wherein each of the lower region, the upper region, and the isolation region includes silicon, germanium, both silicon and germanium, or a group III-V semiconductor material.

14. An integrated circuit including at least one transistor, the integrated circuit comprising:

a fin extending from a substrate, the fin including a lower portion and an upper portion, a first portion including carbon between the lower portion and the upper portion, and a second portion between the lower portion and the first portion, the second portion including oxygen;

a gate structure at least over the upper portion of the fin, the gate structure including a gate electrode and a gate dielectric, the gate dielectric between the upper portion of the fin and the gate electrode; and a first region and a second region, the upper portion of the fin between the first and second regions, wherein the first and second regions include semiconductor material.

15. The integrated circuit of claim 14, wherein the second portion includes an oxide material.

16. The integrated circuit of claim 15, wherein the upper or lower portions of the fin includes semiconductor material and the second portion includes an oxide of the semiconductor material of either the upper or lower portions of the fin.

17. The integrated circuit of claim 14, wherein each of the first portion and the second portion extends under the first and second regions, such that each of the first portion and the second portion is between the first region and the lower portion, and each of the first portion and the second portion is also between the second region and the lower portion.

18. The integrated circuit of claim 14, wherein the semiconductor material of the first and second regions includes a first semiconductor element, and each of the lower portion, the upper portion, the first portion, and the second portion includes a second semiconductor element different than the first semiconductor element.

* * * * *